United States Patent
Uang et al.

(10) Patent No.: US 7,605,474 B2
(45) Date of Patent: Oct. 20, 2009

(54) STRUCTURE OF POLYMER-MATRIX CONDUCTIVE FILM AND METHOD FOR FABRICATING THE SAME

(75) Inventors: Ruoh Huey Uang, Hsinchu County (TW); Yu Chih Chen, Yilan County (TW); Ren Jen Lin, Taipei County (TW); Syh Yuh Cheng, Hsinchu County (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 11/477,412

(22) Filed: Jun. 30, 2006

(65) Prior Publication Data
US 2006/0243972 A1 Nov. 2, 2006

Related U.S. Application Data

(63) Continuation of application No. 10/998,741, filed on Nov. 30, 2004.

(30) Foreign Application Priority Data

Oct. 8, 2004 (TW) .............................. 93130523 A

(51) Int. Cl.
*H01L 23/48* (2006.01)
(52) U.S. Cl. .................. 257/773; 257/734; 257/783; 257/792; 257/E23.007; 257/E23.067; 257/E23.119; 977/761; 977/762; 977/766; 977/770; 977/778

(58) Field of Classification Search ................ 257/40; 977/761, 762, 766, 770, 776
See application file for complete search history.

(56) References Cited

U.S. PATENT DOCUMENTS

| 4,888,247 | A | | 12/1989 | Zweben et al. | 428/105 |
|---|---|---|---|---|---|
| 5,049,085 | A | * | 9/1991 | Reylek et al. | 439/91 |
| 5,262,226 | A | | 11/1993 | Yoshida | |
| 5,805,426 | A | | 9/1998 | Merritt et al. | |
| 6,000,126 | A | * | 12/1999 | Pai | 29/840 |
| 6,459,039 | B1 | * | 10/2002 | Bezama et al. | 174/359 |
| 6,528,867 | B1 | | 3/2003 | Ahmad | 257/666 |
| 7,190,049 | B2 | * | 3/2007 | Tuominen et al. | 257/618 |
| 2008/0292840 | A1 | * | 11/2008 | Majumdar et al. | 428/114 |

\* cited by examiner

*Primary Examiner*—Jasmine J Clark
(74) *Attorney, Agent, or Firm*—Bacon & Thomas, PLLC

(57) ABSTRACT

A composite conductive film formed of a polymer-matrix and a plurality of conductive lines less than micro-sized and its fabricating method are provided. The conductive lines are arranged parallel and spaced apart from each other so as to provide anisotropic conductivity. The present conductive film can serve as an electrical connection between a fine-pitch chip and a substrate. Additionally, an adhesive layer is formed on two opposite sides of the conductive film along its conductive direction to increase adhesive areas. The strength and reliability of the package using the conductive film are thus enhanced.

6 Claims, 8 Drawing Sheets

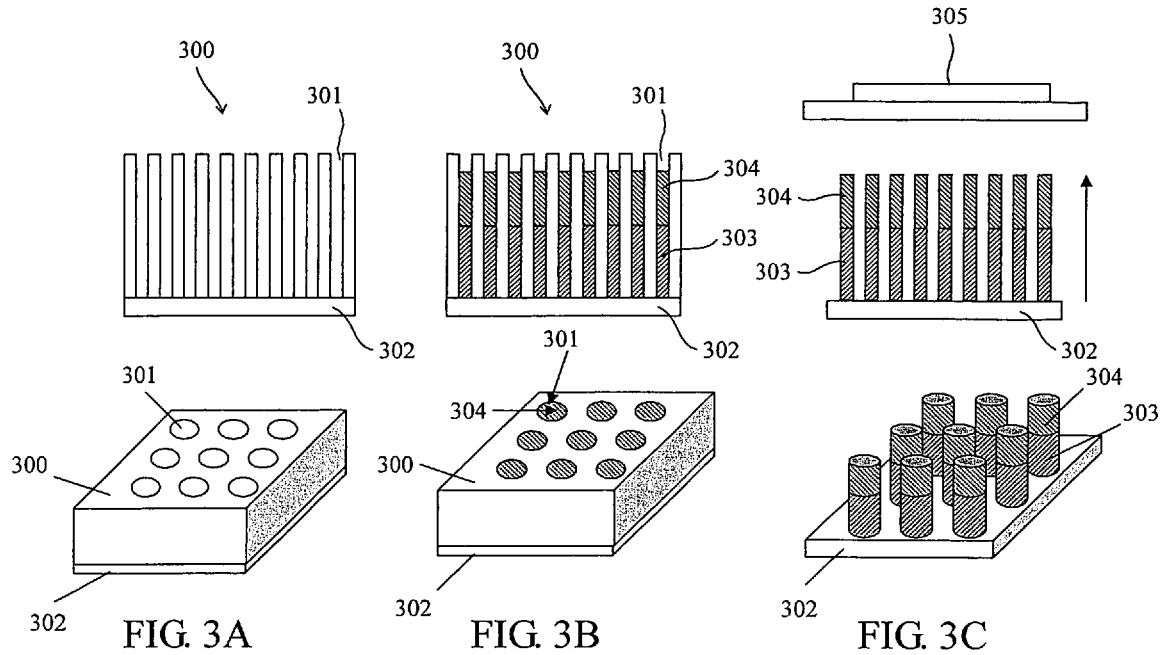
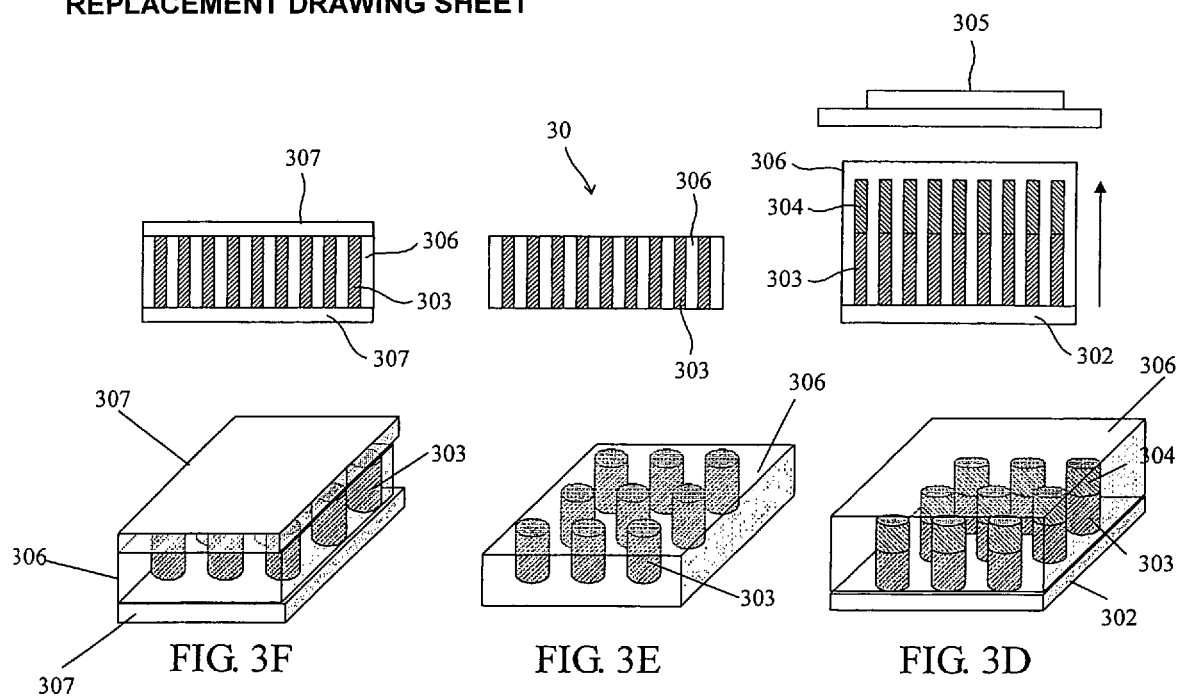
FIG. 3A  FIG. 3B  FIG. 3C
FIG. 3F  FIG. 3E  FIG. 3D

STRUCTURE OF POLYMER-MATRIX CONDUCTIVE FILM AND METHOD FOR FABRICATING THE SAME

This application is a continuation application of pending U.S. application Ser. No. 10/998,741, filed Nov. 30, 2004 (of which the entire disclosure of the pending, prior application is hereby incorporated by reference).

BACKGROUND OF THE INVENTION

1. Field of the Invention

The present invention relates to a Z-axis conductive film and a method for fabricating the same, and more particularly, the present invention relates to a composite conductive film including a polymer matrix and conductive nanowires and a method for fabricating the same.

2. Description of the Related Art

Interconnection technology of a flip-chip package for the I/O pitch less than 50 μm (micrometer) is accomplished by Z-axis conductive films. However, Z-axis conductive film cannot be used in a flip-chip package with pitch smaller than 30 μm because the size of the conductive particles in Z-axis conductive film is approximately 3 μm, and this size cannot be reduced any further. As a result, Z-axis conductive film cannot be used in the flip-chip package of the pitch less than 30 μm. The electrical conduction of Z-axis conductive film is realized by contact between metallic films chemically electroplated on surfaces of polymer particles and electrodes of a chip and a substrate. This contact is a kind of physical contact, and has a larger joint resistance relative to the chemical joint of soldering. Hence, Z-axis conductive film is not suitable for integrated circuit devices driven by current.

In addition, joint resistance is related to the density of the conductive particles in conductive film. But the density of the conductive particles in conventional Z-axis conductive film is not very high for the purpose of maintaining insulation in X and Y directions (i.e. avoiding lateral short circuits). As the pitches of the packaged devices become smaller in the future, the electrodes' areas decrease. Joint resistance will be increased as the density of the conductive particles is decreased.

In addition to Z-axis conductive film, solder bumps are used to electrically connect the electrodes of the chip and substrate. Since the coefficients of thermal expansion (CTE) of the chip and substrate are mismatched, the stress there between adversely influences the reliability of the connection of the chip and the substrate. It is necessary to use underfill between the chip and the substrate after packaging. However, when the jointing pitch is reduced to a size of less than 100 μm, the underfill does not easily enter the space between the chip and the substrate. The current methods to resolve this drawback include: (i) replacing the ball-shaped solder bump with a copper stud having a high height-to-width ratio to increase the gap between the chip and the substrate; and (ii) adapting conductive polymer bumps with low Young's modulus to serve as stress buffers. However, the above methods have disadvantages. The Young's modulus of the copper stud is larger than that of the solder bump, and is a poor stress buffer. The resistance of the conductive polymer is at least ten times greater than that of metal. Therefore, the conductive polymer is not suitable for electrical connection of the flip-chip package with fine pitches and small electrode areas.

Accordingly, a Z-axis conductive film for electrical connection of a fine-pitched flip-chip package was developed. For example, U.S. Pat. No. 5,805,426, entitled "Microelectronic Assembles Including Z-Axis Conductive Films", provides a Z-axis conductive film, as shown in FIG. 1, which uses a nanoporous polymer film as a template. By filling pores of the polymer film, a composite conductive film formed of nanowires (31, 34, 37) and polymer is provided. The chip and substrate can be directly press jointed together by this composite conductive film. Electrical connection there between is established by the metallic nanowires (31, 34, 37) and pads (32, 33, 35, 36) of the chip and substrate. The CTE of the composite conductive film can be varied or its thermal conductivity can be increased by selectively filling different metals in the pores of different positions. The nanoporous polymer film is made by exposing a nonporous resin film to accelerated ion beam having sufficient energy or a light beam to pass through the entire thickness of the film. The above method is costly and time-consuming. Moreover, the uniformity of the pore diameters is not easily controlled. The differences of the pore diameters can be as great as hundreds of nanometers or more. Since the pores of the polymer film are previously formed, the polymer film cannot be a B-stage polymer. Thus, the polymer film cannot provide sufficient adhesion during a subsequent jointing step by thermal press to maintain contact between the electrodes of the chip and the substrate and metal nanowires. Thus, the reliability of electrical connection of the composite polymer film is degraded.

Additionally, U.S. Pat. No. 5,262,226 provides an Z-axis conductive film, as shown in FIG. 2, which includes an alumina substrate 2 having a plurality of metal nanowires 3 formed therein. U.S. Pat. No. 5,262,226 thus provides a conductive film 1 made of an alumina substrate 2 and metal nanowires 3, which is made by two methods. One method involves selectively undergoing an anodic oxidation process to form a conductive film 1 composed of aluminum (Al) 3/alumina ($Al_2O_3$) substrate 2. The conductive aluminum 3 can be replaced by solder ball/gold/solder ball. However, this manufacturing method is limited to the capability of a photolithographic process, and can merely manufacture metal wires with a diameter of 20 μm or more. The other method is firstly to manufacture a porous template of alumina, and then selectively electroplate metal in some of the pores to form a conductive film having a plurality of metal wires. Thereafter, one electrode is respectively formed at the upper and lower ends of each metal wire to joint a substrate-level chip. Alumina ($Al_2O_3$) is used as a substrate of the conductive film 1 of U.S. Pat. No. 5,262,226. Alumina has good heat-dissipation and insulating properties, but its Young's modulus is too large and too fragile to release stress generated during packaging. Moreover, the adhesion between alumina and the substrate, as well as between alumina and the chip is insufficient to maintain electrical connection of the electrodes and the conductive film.

Accordingly, the intention is to provide a Z-axis conductive film with fine pitches, low resistance and high jointing strength, which can overcome the drawbacks of the prior art.

SUMMARY OF THE INVENTION

One objective of the present invention is to provide a structure of polymer-matrix conductive film and a method for fabricating the same, which is suitable for electrical connection between a fine-pitched chip and a fine-pitched substrate.

A second objective of the present invention is to provide a sandwiched polymer-matrix conductive film and a method for fabricating the same, which can provide a Z-axis conductive film with a larger adhesive area to strengthen the package of a semiconductor device.

A third objective of the present invention is to provide a structure of anisotropic polymer-matrix conductive film and a method for fabricating the same, which can provide an input/output redistribution function in order that the current substrate can be applied to a package of fine-pitched chip in the future.

In order to attain the above objectives, the present invention provides a polymer-matrix conductive film, which includes a polymer-matrix conductive body having unidirectional conductivity, a plurality of conductive lines arranged parallel and spaced apart from each other and a polymer material filled in spacings of the conductive lines. An adhesive layer is respectively formed on two opposite sides of the polymer-matrix conductive body along the direction of conductivity. Hence, a sandwiched polymer-matrix conductive film is provided.

A larger adhering area is provided between the chip and the substrate by the sandwiched polymer-matrix conductive film. The portions of the chip and the substrate, except for their electrodes, are jointed with the polymer-matrix conductive film by the adhesive layer so as to enhance the package strength of the semiconductor device.

In another aspect, the present invention provides a method for fabricating a polymer-matrix conductive film, which comprises providing a template having a plurality of holes arranged parallel and spaced apart from each other and an electrode provided on one end of the holes; filling a first conductive material in the holes of the template over the electrode; filling a magnetic material in the holes on the first conductive material; removing the template to form a plurality of double-layered conductive lines arranged parallel and spaced apart from each other; applying a magnetic field upon the double-layered conductive lines and filling a polymer material in spacings of the double-layered conductive lines; and removing the electrode, a portion of the polymer material and the magnetic material to form the polymer-matrix conductive film with a plurality of conductive lines arranged parallel and spaced apart from each other.

The present method can manufacture a composite conductive film having a polymer matrix and a plurality of conductive lines less than nanometers formed therein, which is suitable for electrical connection between the chip and the substrate with fine pitches.

BRIEF DESCRIPTION OF THE DRAWINGS

These and other features, aspects and advantages of the present invention will be better understood with regard to the following description, appended claims and accompanying drawings that are provided only for further elaboration without limiting or restricting the present invention, where:

FIGS. 3A through 3F are schematic cross-sectional views of a polymer-matrix conductive film corresponding to various stages of the present method according to a first preferred embodiment of the present invention;

DETAILED DESCRIPTION OF THE PREFERRED EMBODIMENTS

Figure 1:
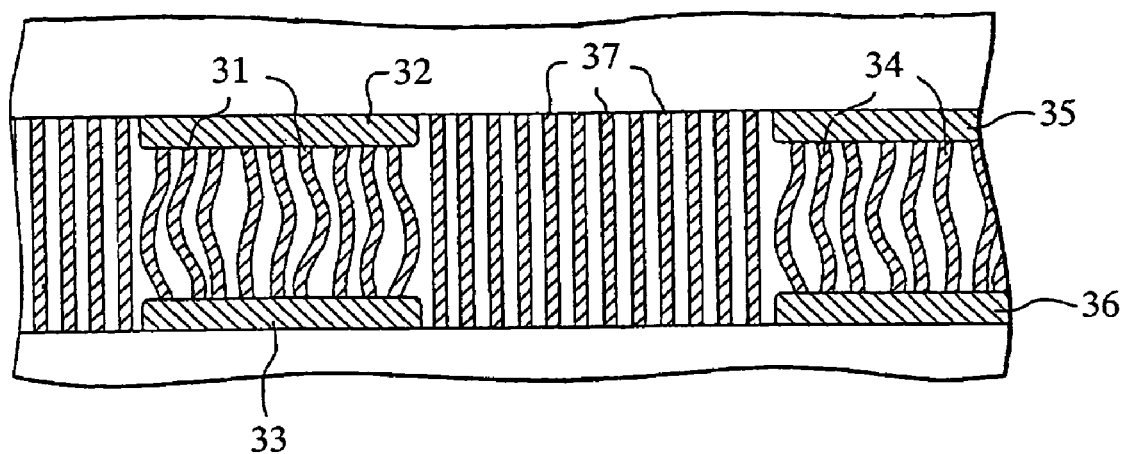
FIG. 1 is a schematic cross-sectional view of a conventional package of a semiconductor device utilizing a known Z-axis conductive film as an electrical connection.
Figure 2:
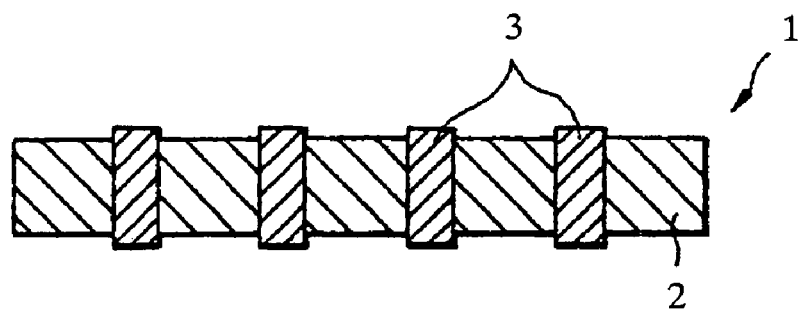
FIG. 2 is a schematic cross-sectional view of another known Z-axis conductive film.

The present invention provides a universal Z-axis conductive film, which comprises a polymer matrix and a plurality of conductive lines less than micro-sized. The present Z-axis conductive film is suitable for a package of a semiconductor device in 45 nm technology node. The polymer matrix can be made of a material with a low Young's modulus to aid as a stress buffer during the subsequent packaging of the semiconductor device. In addition, the structure and composition of the conductive lines can be varied such that the present Z-axis conductive film can connect electrically with the chip and the substrate by bonding. The jointing resistance can thus be lowered.

However, it is necessary to keep Z-direction parallel of the conductive lines so as to maintain good insulation of the present Z-axis conductive film in X-Y directions. However, the diameter of the currently-used conductive lines is approximately 200 nm (nanometers) or less and their length is 10 μm (micrometers) or more. The height-to-width ratio of the conductive lines is high, and thus the conductive lines are easily inclined when subjected to external force. The polymer matrix is preferably made of a thermosetting polymer with a glass transition temperature ($T_g$) higher than 250° C. Moreover, an adhesive layer can be formed respectively on two jointing surfaces of the present polymer-matrix conductive film to enhance jointing strength between the chip and the substrate, and also increasing insulation of the present Z-axis conductive film in X-Y directions.

More specifically, the present polymer-matrix conductive film is a kind of composite film having a polymer matrix and a plurality of nanowires formed therein. The nanowires are made of a low resistance metal and inactive for oxidation, such as gold and silver. Multi-layered metal lines containing solder can be used as the nanowires for bonding to the electrodes of the substrate and chip. The polymer matrix can be made of a thermosetting polymer with $T_g$ higher than 250° C. and a low Young's modulus to maintain the nanowires parallel in the vertical direction and buffer the stress generated during the jointing of the chip and the substrate.

The upper and lower surfaces of the nanowires/polymer matrix composite film can also be respectively coated with an adhesive layer in order that the portions of the chip and the substrate, except for their electrodes, joint with the polymer-matrix conductive film by the adhesive layer, increasing the adhering area and thus strengthening the package.

The present polymer-matrix conductive film and the method for fabricating the same will be described in detail according to the following preferred embodiments with reference to accompanying drawings.

FIGS. 3A through 3F are schematic cross-sectional views of a polymer-matrix conductive film corresponding to various stages of the present method according to a first preferred embodiment of the present invention. Referring to FIG. 3A, initially, a template 300 is provided. The template 300 includes a plurality of holes 301 arranged parallel and spaced apart from each other and an electrode 302 is provided at one end of the holes 301. In the first preferred embodiment, the template 300 can be a template of alumina (Al$_2$O$_3$) with pores of a size less than 200 nanometers. The electrode 302 can be made of a high conductive material, such as gold or silver. Next, referring to FIG. 3B, a first conductive material 303 is filled in the holes 301 over the electrode 302. Then, a magnetic material 304 is filled in the holes 301 on the first conductive material 303. Double-layered nanowires are provided. In the first preferred embodiment, the first conductive material 303, such high conductive gold or silver, and the magnetic material 304, such as cobalt or nickel, can be sequentially filled in the holes 301 by electroplating to form double-layered metal nanowires. Thereafter, the template 300 is removed to form a plurality of double-layered conductive lines 303 and 304 arranged parallel and spaced apart from each other, such as double-layered metal wires of gold (silver) 303/cobalt (nickel) 304. Subsequently, referring to FIGS. 3C and 3D, a magnetic field 305 is applied to the double-layered conductive lines 303 and 304. By applying the magnetic field 305, a polymer material 306 is filled in the spacings of the double-layered conductive lines 303 and 304 for example by diffusion. The polymer material 306 can be made of a thermosetting polymer with a low Young's modulus, such as epoxy resin or polyimide, to maintain the double-layered conductive lines 303 and 304 parallel during subsequent manufacturing processes and serve as a stress buffer when packaging the semiconductor device. Moreover, in the first preferred embodiment, the interaction between the magnetic field 305 and the magnetic material 304 helps to maintain the Z-directionality and the double-layered conductive lines 303 and 304 parallel after removing the template 300 and during the filling of the polymer material 306. Additionally, before filling the polymer material 306, it is preferable to use a long chain organic acid to modify the surfaces of the double-layered conductive lines 303 and 304 to become more hydrophobic surfaces for facilitating the flow in of the polymer material 306. Thereafter, the baked polymer material 306 is hardened. Next, referring to FIG. 3E, a portion of the polymer material 306 and magnetic material 304 is polished and the electrode 302 is removed. As a consequence, the polymer-matrix conductive film 30 with a plurality of conductive lines 303 arranged parallel and spaced apart from each other is provided. Thus the polymer-matrix conductive film 30 has a Z-directional conductivity. Finally, referring to FIG. 3F, an adhesive layer 307, preferably a B-stage polymer, is coated respectively on two opposite sides of the polymer-matrix conductive film 30 across the direction of conductivity. A sandwiched polymer-matrix conductive film is provided, which increases the adhering area between the chip and the substrate and the jointing strength there between is enhanced.

Figure 4F:
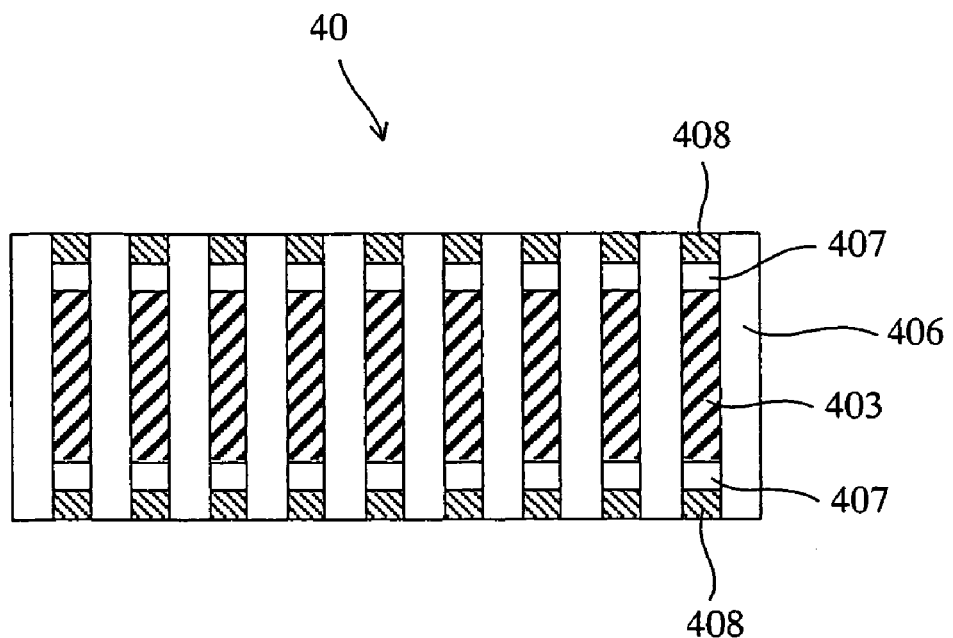
FIGS. 4F to 4G are schematic cross-sectional views of a polymer-matrix conductive film corresponding to the last two steps of the present method according to a second preferred embodiment.
Figure 4G:
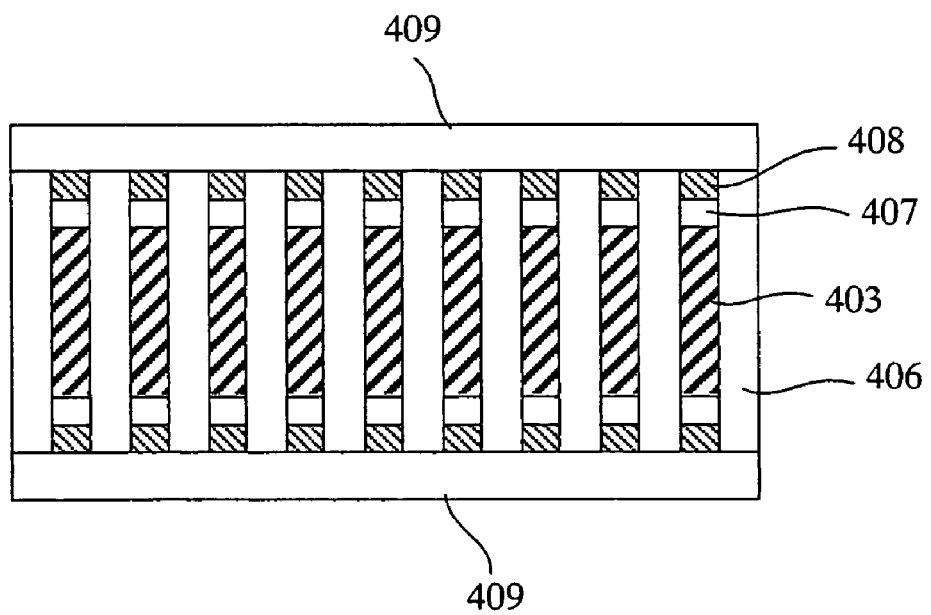

FIGS. 4F to 4G are schematic cross-sectional views of the present polymer-matrix conductive film corresponding to the last two steps of the present method according to a second preferred embodiment of the present invention. The former several steps of the second preferred embodiment are the same as those steps of the first preferred embodiment corresponding to drawings of FIGS. 3A to 3E. In a step corresponding to FIG. 4F, a barrier layer 407 and a solder ball 408 are sequentially formed on two opposite ends of the conductive lines 403 of the polymer-matrix conductive film to form a polymer-matrix conductive film 40 with multi-layered conductive lines. The multi-layer conductive lines 403 are arranged parallel and spaced apart from each other to provide unidirectional conductivity. When the conductive lines 403 of the polymer-matrix conductive film 40 are made of gold, the barrier layer 407 between the conductive lines 403 and solder balls 408 can be made of nickel. Hence, the polymer-matrix conductive film 40 can bond to the electrodes of the substrate and the chip. Subsequently, referring to FIG. 4G, an adhesive layer 409, preferably of a B-stage polymer, is respectively coated on the two opposite sides of the polymer-matrix conductive film 40 along the direction of conductivity to form the sandwiched polymer-matrix conductive film.

Figure 5F:
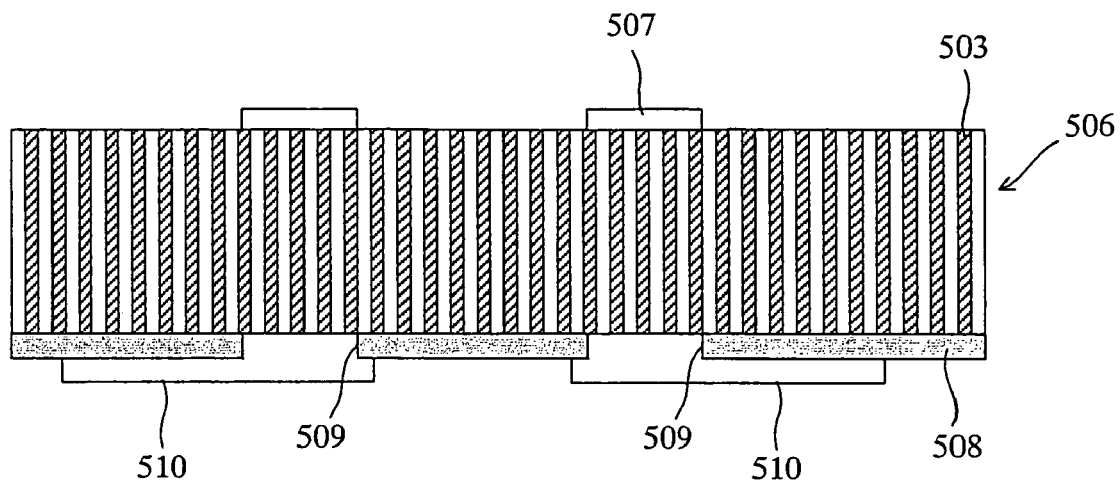
FIGS. 5F to 5G are schematic cross-sectional views of a polymer-matrix conductive film corresponding to the last two steps of the present method according to a third preferred embodiment.
Figure 5G:
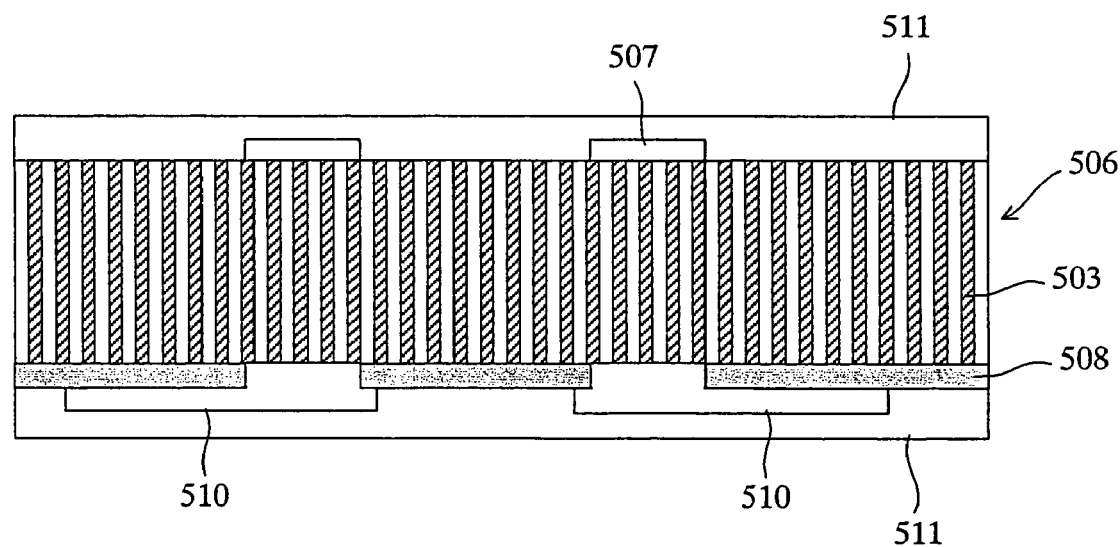

FIGS. 5F to 5G are schematic cross-sectional views of the present polymer-matrix conductive film corresponding to the last two steps of the present method according to a third preferred embodiment of the present invention. The former several steps of the third preferred embodiment are the same as those steps of the first preferred embodiment corresponding to the drawings of FIGS. 3A to 3E. A polymer-matrix conductive film 506 with a plurality of conductive lines 503 arranged parallel and spaced apart from each other is first provided. In a step corresponding to the drawing of FIG. 5F, a plurality of conductive pads 507 are formed on one side of the polymer-matrix conductive film along the direction of conductivity to serve as an electrical connection with the electrodes of the chip in the subsequent packaging process. Next, a dielectric layer 508 is formed on the other side of the polymer-matrix conductive film along the direction of conductivity. A plurality of openings 509 are then formed in the dielectric layer 508. Afterward, a second conductive material is filled in the openings 509 to form a conductive redistribution layer 510 under the dielectric layer 508. The conductive redistribution layer 510 is used as an electrical connection with the electrodes of the substrate. Thus, in the third preferred embodiment, the conductive redistribution layer 510 is formed on the jointing surfaces between the polymer-matrix conductive film and the substrate to enlarge input/output (I/O) pitches of the polymer-matrix conductive film for electrical connection with the substrate. When the I/O pitches of the chip become smaller in the future, the currently used organic substrate can still be electrically connected with the chip by the polymer-matrix conductive film of the third preferred embodiment. Briefly, this polymer-matrix conductive film provides the functions of vertical electrical connection and I/O redistribution such that the manufacturing process of the current substrate can be integrated with the packaging of chips having fine pitches in the future. Subsequently, referring to FIG. 5G, an adhesive layer 511 is respectively formed on the conductive pads 507 and under the conductive redistribution layer 510.

Figure 6F:
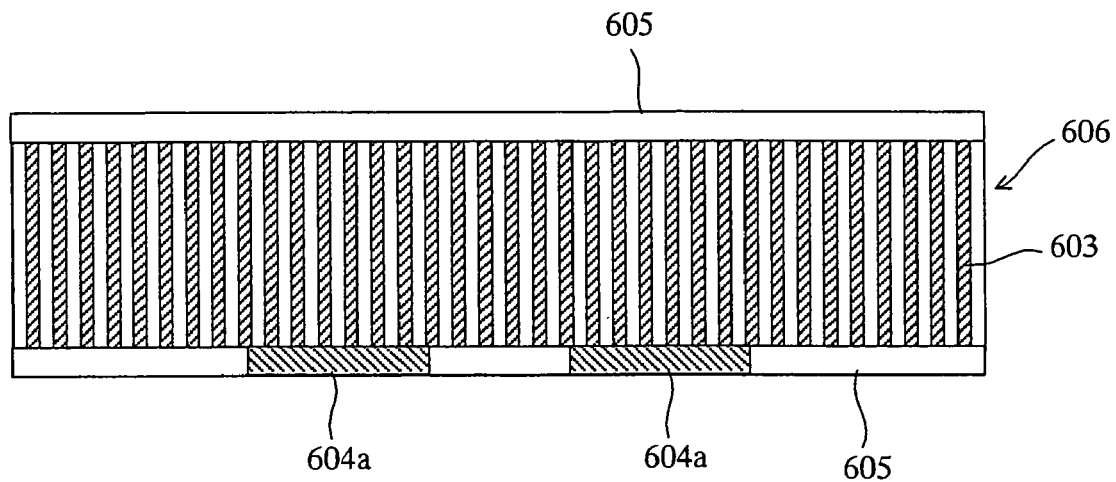
FIG. 6F is a schematic cross-sectional view of a variance of the present polymer-matrix conductive film.

FIG. 6F is a schematic cross-sectional view of the present polymer-matrix conductive film corresponding to the last step of the present method according to a fourth preferred embodiment of the present invention. The former several steps of the fourth preferred embodiment are the same as those steps of the first preferred embodiment corresponding to the drawings of FIG. 3A to FIG. 3E. A polymer-matrix conductive film 606 with a plurality of conductive lines 603 arranged parallel and spaced apart from each other is first provided. In a step corresponding to FIG. 6F, a plurality of conductive pads 604a are formed on one side of the polymer-matrix conductive film 606 along the direction of conductivity. Next, an adhesive layer 605 is respectively formed on the other side of the polymer-matrix conductive film 606 along the direction of conductivity and under the conductive pads 604a.

Figure 6G:
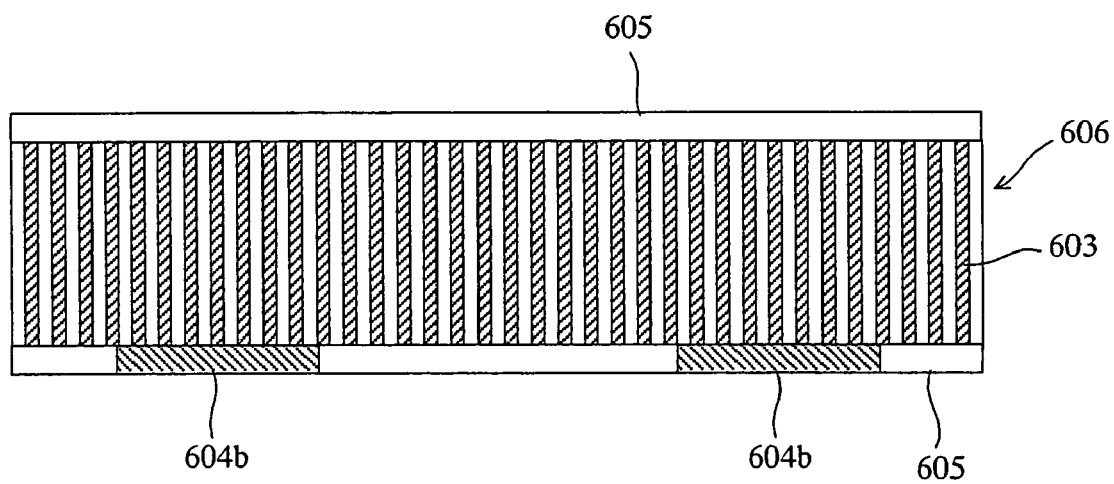
FIG. 6G is a schematic cross-sectional view of another variance of the present polymer-matrix conductive film.

FIG. 6G is a variance of the polymer-matrix conductive film of FIG. 6F. In FIG. 6G, the pitches of the conductive pads 604b on one side of the polymer-matrix conductive film 606 are enlarged such that the pitches of the conductive pads 604b are larger than those of the conductive pads 604a. When the two polymer-matrix conductive films 606 are stacked, the conductive pads 604a and 604b partially overlap. Hence, by stacking the polymer-matrix conductive films of FIGS. 6F and 6G to make the conductive pads 604a and 604b partially overlap, conductive layer redistribution can be attained and an enlargement of the I/O pitches of the polymer-matrix conductive film is obtained.

By stacking multiple layers of the polymer-matrix conductive films each of which have conductive pads with respective different pitches, conductive layer redistribution can be obtained, and an enlargement of the I/O pitches of the polymer-matrix conductive film is attained such that the manufacturing process of the current substrate can be integrated with the future packaging of chips with fine pitches.

Figure 7:
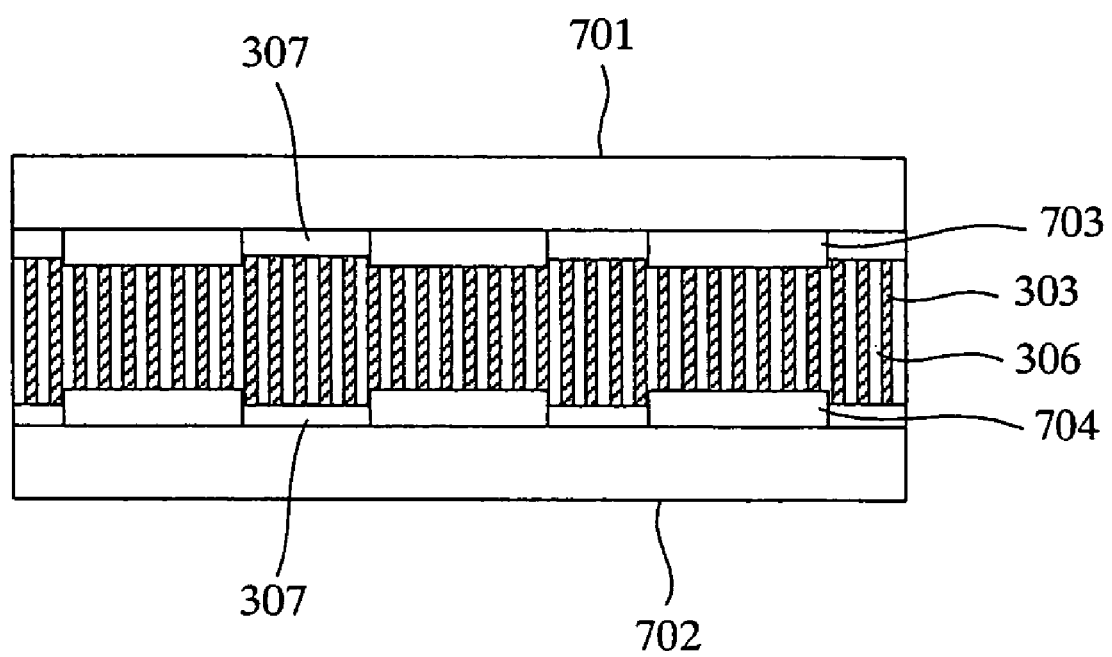
FIG. 7 is a schematic cross-sectional view of a package of a semiconductor device utilizing the polymer-matrix conductive film of the first preferred embodiment.

The present invention also provides various packages of semiconductor devices utilizing the present polymer-matrix conductive films. FIG. 7 is a schematic cross-sectional view of the package of the semiconductor device utilizing the polymer-matrix conductive film of the first preferred embodiment (referring to FIG. 3F) to serve as electrical connection between the chip 701 and the substrate 702. The substrate 702 has a circuit pattern (not shown) and a plurality of electrodes (first pads) 704 electrically connected to the circuit pattern. The electrodes (second pads) 703 of the chip 701 and the electrodes 704 of the substrate 702 are respectively electrically connected with the two ends of the conductive lines 306 of the polymer-matrix conductive film by thermal press. Therefore, electrical connection between the chip 701 and the substrate 703 is established. As to the portions of the chip 701 and substrate 702, except for the electrodes 703 and 704, which are jointed with the polymer-matrix conductive film by the adhesive layers 307, the adhering area is larger and the strength of the package is thus enhanced.

Figure 8:
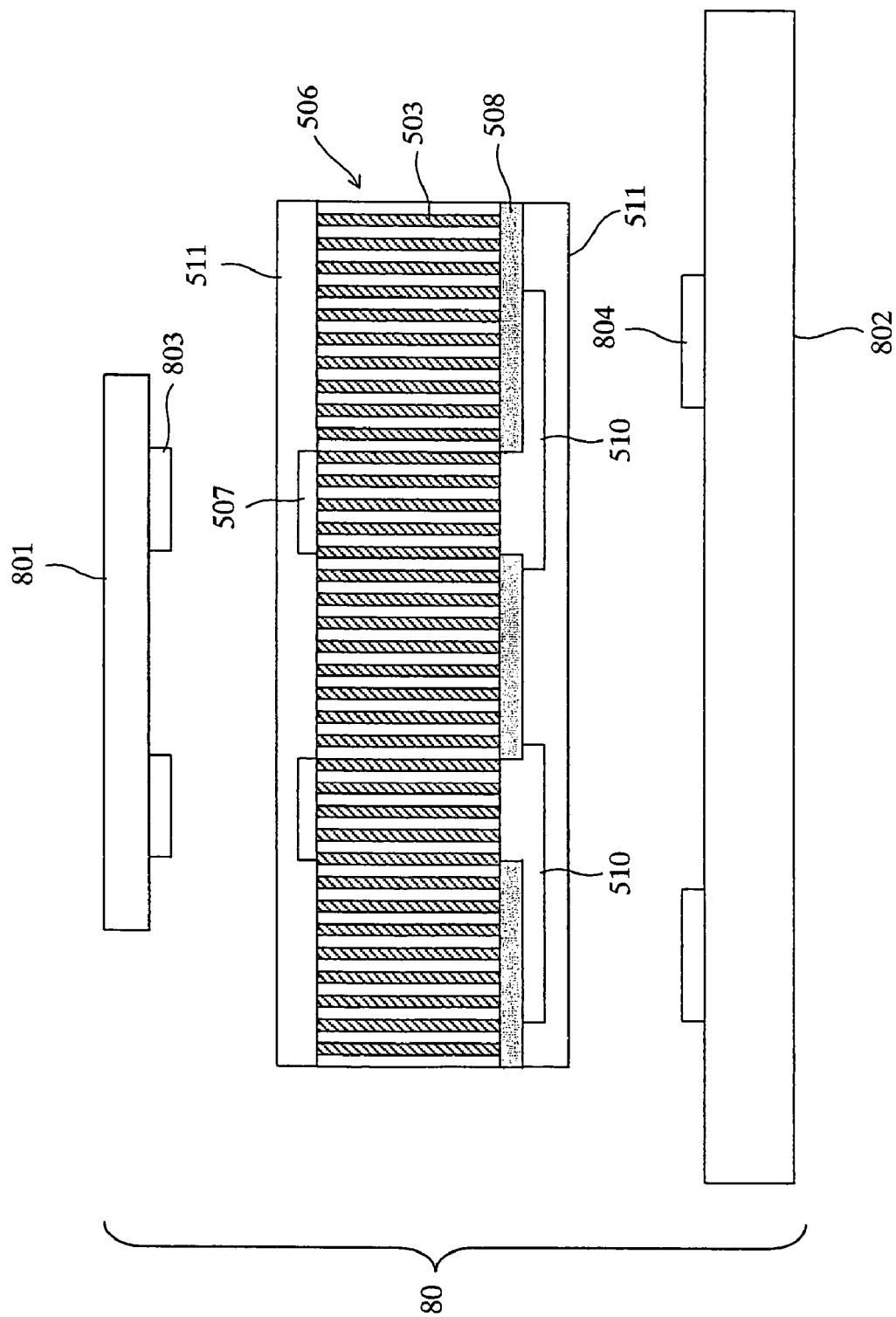
FIG. 8 is a schematic exploded view of a package of a semiconductor device utilizing the polymer-matrix conductive film of the third preferred embodiment.

FIG. 8 is a schematic exploded view of a semiconductor device package 80 utilizing the polymer-matrix conductive film 506 (referring to FIG. 5G) of the third preferred embodiment to serve as electrical connection between the chip 801 and the substrate 802. The substrate 802 has a circuit pattern and a plurality of electrodes (first pads) 804 with larger I/O pitches electrically connected to the circuit pattern. The electrodes (second pads) 803 of the chip 801 are electrically connected to the conductive pads 507 of the polymer-matrix conductive film. The electrodes 804 of the substrate 802 are electrically connected to the conductive redistribution layer 510 of the polymer-matrix conductive film 506. As to the portions of the chip 801 and the substrate 802, except for the electrodes 803 and 804, which are jointed with the polymer-matrix conductive film 506 by the adhesive layer 511. Since the conductive redistribution layer 510 can enlarge the I/O pitches of the polymer-matrix conductive film 506 electrically connected to the substrate 506, the current-used substrate can be integrated with the flip-chip package with fine pitches in the future.

Figure 9:
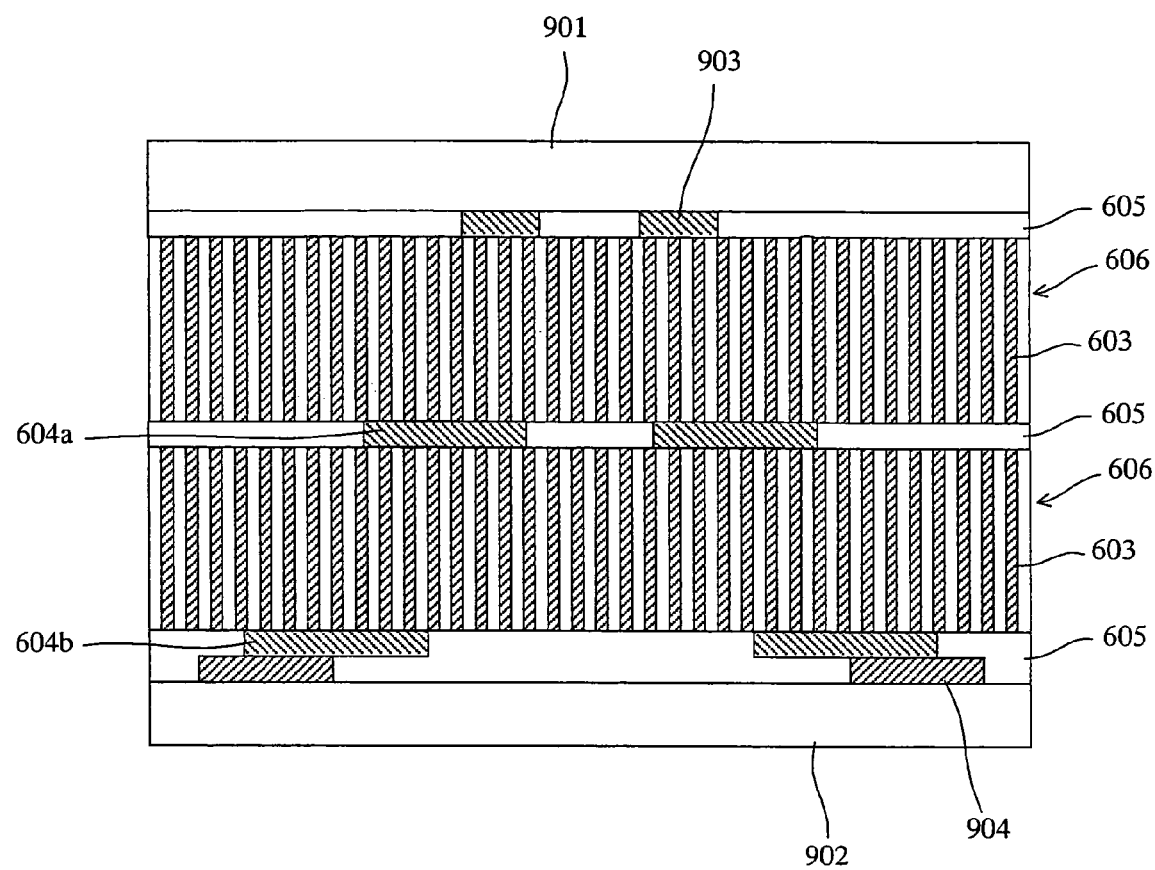
FIG. 9 is a schematic cross-sectional view of a package of a semiconductor device utilizing the polymer-matrix conductive films of FIGS. 6F and 6G.

FIG. 9 is a schematic cross-sectional view of a package of a semiconductor device utilizing the polymer-matrix conductive film 606 (referring to FIG. 6F) and its variance (referring to FIG. 6G) to serve as an electrical connection between the chip 901 and the substrate 902. The substrate 902 has a circuit pattern and a plurality of electrodes 904 with larger I/O pitches electrically connected to the circuit pattern. The electrodes 903 of the chip 901 are electrically connected to one end of multiple conductive lines 603 of the polymer-matrix conductive film 606. The polymer-matrix conductive films 606 of FIGS. 6F and 6G are stacked together such that the conductive pads 604a and 604b partially overlap. The conductive pads 604a are directly electrically connected to one end of the multiple conductive lines 603 of the polymer-matrix conductive film adjacent thereto. The conductive pads 604b are directly electrically connected to the electrodes 904 of the substrate 902. As to the portions of the chip 901 and substrate 902, except for the electrodes 903 and 904, which are jointed with the polymer-matrix conductive film by the adhesive layers 605. In the package of FIG. 9, conductive layer redistribution is obtained by stacking multiple polymer-matrix conductive films 606, each of which has respective conductive pads 604a and 604b, with different pitches. The purpose of enlarging the I/O pitches of the polymer-matrix conductive film is attained. The currently used substrate thus can be integrated with the future flip-chip package with fine pitches.

Although the present invention has been described in considerable detail with reference to certain preferred embodiments thereof, those skilled in the art can easily understand that all kinds of alterations and changes can be made within the spirit and scope of the appended claims. Therefore, the spirit and scope of the appended claims should not be limited to the description of the preferred embodiments contained herein.

What is claimed is:

1. A polymer-matrix conductive film, comprising:
   a polymer-matrix conductive body with unidirectional conductivity, including a plurality of solid conductive nanowires arranged parallel and spaced apart from each other and a polymer material filled in the spaces between the solid conductive nanowires; and
   an adhesive layer on each of two opposite sides of said polymer-matrix conductive body across the direction of conductivity.

2. The polymer-matrix conductive film of claim 1, wherein said polymer material is a thermosetting polymer having a glass transition temperature (Tg) higher than a temperature for a thermal joint process.

3. The polymer-matrix conductive film of claim 2, wherein said adhesive layer includes a B-stage polymer.

4. The polymer-matrix conductive film of claim 1, wherein said adhesive layer includes a B-stage polymer.

5. The polymer-matrix conductive film of claim 1, wherein each of said solid conductive nanowires has an aspect ration equal to or larger than 50.

6. The polymer-matrix conductive film of claim 1, wherein said solid conductive nanowires are arranged parallel and spaced apart from each other with a pitch not more than 1 μm.

* * * * *